(12) United States Patent
Fujita et al.

(10) Patent No.: US 12,063,861 B2
(45) Date of Patent: Aug. 13, 2024

(54) HEAT FLOW SWITCHING ELEMENT

(71) Applicants: MITSUBISHI MATERIALS CORPORATION, Tokyo (JP); TOYOTA SCHOOL FOUNDATION, Nagoya (JP)

(72) Inventors: Toshiaki Fujita, Naka (JP); Koya Arai, Naka (JP); Tsunehiro Takeuchi, Nagoya (JP); Takuya Matsunaga, Nagoya (JP)

(73) Assignees: MITSUBISHI MATERIALS CORPORATION, Tokyo (JP); TOYOTA SCHOOL FOUNDATION, Nagoya (JP)

( * ) Notice: Subject to any disclaimer, the term of this patent is extended or adjusted under 35 U.S.C. 154(b) by 820 days.

(21) Appl. No.: 16/830,955

(22) Filed: Mar. 26, 2020

(65) Prior Publication Data

US 2021/0249577 A1  Aug. 12, 2021

(30) Foreign Application Priority Data

Feb. 6, 2020 (JP) ................................ 2020-018679

(51) Int. Cl.
*H10N 10/817* (2023.01)
*F25B 21/02* (2006.01)
(Continued)

(52) U.S. Cl.
CPC ........... *H10N 10/817* (2023.02); *F25B 21/02* (2013.01); *F28F 13/16* (2013.01); *H10N 10/01* (2023.02); *H10N 10/13* (2023.02)

(58) Field of Classification Search
CPC ........... F28F 13/16; F25B 21/02; F25B 21/04; F25B 2321/02; H10N 10/10
See application file for complete search history.

(56) References Cited

U.S. PATENT DOCUMENTS 11,362,255 B2 * 6/2022 Fujita ..................... H10N 10/82
2012/0139074 A1 * 6/2012 Abe .......................... G01J 5/12
257/E27.123
(Continued)

FOREIGN PATENT DOCUMENTS

CN         104868046 A  *  8/2015  .............. F25B 21/02
JP         2781892 B2       7/1998
(Continued)

OTHER PUBLICATIONS

Luo, Xichun Qin, Yi. (2018). Hybrid Machining—Theory, Methods, and Case Studies—3.7.2 Thermal Conduction for Laser Hearing. Table 3.2. p. 61. Elsevier. Retrieved from https://app.knovel.com/hotlink/pdf/id:kt00CYKTD1/hybrid-machining-theory/thermal-conduction-laser (Year: 2018).*

(Continued)

*Primary Examiner* — Jenna M Maroney
(74) *Attorney, Agent, or Firm* — Locke Lord LLP; James E. Armstrong, IV; Nicholas J. DiCeglie, Jr.

(57) ABSTRACT

A heat flow switching element includes a substrate of which at least an upper surface is formed of an insulating material, an N-type semiconductor layer, a P-type semiconductor layer, and an insulator layer, in which one semiconductor layer of the N-type semiconductor layer and the P-type semiconductor layer is formed on the substrate, the insulator layer is formed on the one semiconductor layer, and the other semiconductor layer of the N-type semiconductor layer and the P-type semiconductor layer is formed on the insulator layer. In this way, electric charges induced by an external voltage are generated both at and near an interface between the N-type semiconductor layer and the insulator layer and at and near an interface between the P-type semiconductor layer and the insulator layer.

5 Claims, 5 Drawing Sheets

(51) Int. Cl.
*F28F 13/16* (2006.01)
*H10N 10/01* (2023.01)
*H10N 10/13* (2023.01)

(56) References Cited

U.S. PATENT DOCUMENTS

2015/0204585 A1* 7/2015 Won .................. H10N 10/13 136/203
2023/0109145 A1* 4/2023 Fujita .................. G01K 7/22 257/467

FOREIGN PATENT DOCUMENTS

| | | |
|---|---|---|
| JP | 5402346 B2 | 1/2014 |
| JP | 2016-216688 A | 12/2016 |
| KR | 20100113289 A | 10/2010 |
| KR | 20130102206 A | 9/2013 |
| KR | 101795931 B1 | 11/2017 |

OTHER PUBLICATIONS

Davis, J.R.. (2001). ASM Specialty Handbook—Copper and Copper Alloys—1.3 Fabrication Characteristics. Table 4. p. 5. ASM International. Retrieved from https://app.knovel.com/hotlink/pdf/id:kt007NHEU2/asm-specialty-handbook/fabrication-characteristics (Year: 2001).*

Revie, R. Winston. (2011). Uhlig's Corrosion Handbook (3rd Edition)—35.3.1.1 Common Reinforcement Types. John Wiley & Sons. Table 35.1. Resistivities of Reinforcement Materials. (Year: 2011).*

Wypych, George. (2016). Handbook of Fillers (4th Edition)—5.32 Electrical Properties. ChemTec Publishing. Table 5.23 Resistivity and Dielectric Constants of Some Polymers. (Year: 2016).*

Tilli, Markku Paulasto-Kröckel, Mervi Petzold, Matthias Theuss, Horst Motooka, Teruaki Lindroos, Veikko. (2020). Handbook of Silicon Based MEMS Materials and Technologies (3rd Edition)—1.1.1 Crystallography of Silicon. Table 1.1 Basic Parameters of Silicon. Elsevier. (Year: 2020).*

Iau, Peter J.. (1992). ASM Handbook, vol. 18—Friction, Lubrication, and Wear Technology—3.2.3 Circular Contact Analysis with One Body in Motion. Table 2 Typical Thermal Properties of Common Materials. ASM International (Year: 1992).*

Polmear, Ian StJohn, David Nie, Jian-Feng Qian, Ma. (2017). Light Alloys—Metallurgy of the Light Metals (5th Edition)—1.1.2 Beryllium. Table 1.1 Some Physical Properties of Pure Metals. Elsevier. (Year: 2017).*

Bahl, Inder J.. (2014). Control Components Using Si, GaAs, and GaN Technologies—1.5 Fabrication of Control Components. Table 1.1 Comparison of Transistor/Monolithic Integrated-Circuit Substrates. Artech House. (Year: 2014).*

Matsunaga, Takuya et al., "Thermal Switching Device Operating with Bias Voltage," The 15th Annual Meeting of Thermoelectric Society of Japan, Sep. 13, 2018, pp. 89, information page and English abstract thereof.

Office Action issued in Korean Patent application No. KR 10-2020-0037638, mailed Apr. 18, 2024.

* cited by examiner

[Fig. 3]

HEAT FLOW SWITCHING ELEMENT

CROSS REFERENCE TO RELATED APPLICATIONS

This application is related to co-pending application: "HEAT FLOW SWITCHING ELEMENT" filed even date herewith in the names of Toshiaki FUJITA, Koya ARAI, Tsunehiro TAKEUCHI and Takuya MATSUNAGA, which claims priority to Japanese Application No. 2020-018679, filed Feb. 6, 2020; the above-identified application is assigned to the assignee of the present application and is incorporated by reference herein.

BACKGROUND OF THE INVENTION

Field of the Invention

The present invention relates to a heat flow switching element which can actively control thermal conduction with a bias voltage.

Description of Related Art

Conventionally, as a thermal switch that changes thermal conductivity, for example, Patent Document 1 discloses a thermal diode in which two thermal conductors having different thermal expansion coefficients are lightly brought into contact with each other to change a flow of heat depending on a direction of a temperature gradient. Patent Document 2 also discloses a heat radiating device that is a thermal switch using physical thermal contact due to thermal expansion.

In addition, Patent Document 3 discloses a thermal conduction variable device that changes thermal conductivity on the basis of a reversible oxidation-reduction reaction generated by applying a voltage to a compound.

Further, Non-Patent Document 1 proposes a heat flow switching element that changes thermal conductivity by sandwiching a polyimide tape between two sheets of $Ag_2S_{0.6}Se_{0.4}$ to apply an electric field.

PATENT DOCUMENTS

[Patent Document 1] Japanese Patent No. 2781892
[Patent Document 2] Japanese Patent No. 5402346
[Patent Document 3] Japanese Unexamined Patent Application Publication No. 2016-216688

Non-Patent Documents

[Non-Patent Document 1] Matsunaga Takuya and four others, "Thermal Switching Device Operating with Bias Voltage," The 15th Annual Meeting of the Thermoelectric Society of Japan, Sep. 13, 2018.

SUMMARY OF THE INVENTION

The following problems remain in the above-described conventional technology

That is, in the techniques described in Patent Documents 1 and 2, since physical thermal contact resulting from thermal expansion is used, reproducibility cannot be obtained. In particular, a size design is difficult because it is a minute change, and plastic deformation due to mechanical contact pressure cannot be avoided. Further, there is a problem in that an influence of convective heat transfer between materials is too large.

Also, the technique described in Patent Document 3 uses an oxidation-reduction reaction that is a chemical reaction and has a disadvantage that thermal responsiveness is poor and thermal conduction is not stable.

On the other hand, in the technology described in Non-Patent Document 1, since a charge that can conduct heat is generated at an interface between materials by applying a voltage and heat can be carried by the charge, it is possible to immediately shift to a state in which thermal conduction has changed and to obtain relatively good thermal responsiveness. However, since an amount of a generated charge is small, there is a need for a heat flow switching element that increases an amount of a generated charge and has a larger variation in thermal conductivity.

The present invention has been made in view of the problems described above and an object of the present invention is to provide a heat flow switching element which has a larger variation in thermal conductivity and excellent thermal responsiveness.

The present invention has the following constituents in order to solve the problems. That is, a heat flow switching element according to a first invention includes a substrate of which at least an upper surface is formed of an insulating material, an N-type semiconductor layer, a P-type semiconductor layer, and an insulator layer, and is characterized in that one semiconductor layer of the N-type semiconductor layer and the P-type semiconductor layer is formed on the substrate, the insulator layer is formed on the one semiconductor layer, and the other semiconductor layer of the N-type semiconductor layer and the P-type semiconductor layer is formed on the insulator layer.

In this heat flow switching element, since one semiconductor layer of the N-type semiconductor layer and the P-type semiconductor layer is formed on the substrate, the insulator layer is formed on the one semiconductor layer, and the other semiconductor layer of the N-type semiconductor layer and the P-type semiconductor layer is formed on the insulator layer, electric charges induced by an external voltage are generated both at and near an interface between the N-type semiconductor layer and the insulator layer and at and near an interface between the P-type semiconductor layer and the insulator layer. Accordingly, the generated charges increase, and a larger variation in thermal conductivity and high thermal responsiveness can be obtained. In particular, since each layer of the N-type semiconductor layer, the P-type semiconductor layer, and the insulator layer is formed on the substrate, the entire element can ensure flatness and mechanical strength.

Also, since an amount of electric charges induced at the interfaces varies depending on a value multiplied by a magnitude of the external voltage, thermal conductivity can be adjusted by adjusting the external voltage, and thus heat flow can be actively controlled via this element.

In addition, Joule heat does not occur because the upper surface of the substrate is an insulator layer and no electric current is generated as a voltage is applied thereto. For that reason, heat flow can be actively controlled without self-heating.

A heat flow switching element according to a second invention is characterized in that, in the first invention, a plurality of unit elements each including the substrate, the N-type semiconductor layer, and the P-type semiconductor layer are provided, and the plurality of unit elements are vertically laminated and joined to each other such that the respective N-type semiconductor layers are electrically connected to each other and the respective P-type semiconductor layers are electrically connected to each other.

That is, in this heat flow switching element, since the plurality of unit elements are vertically laminated and joined to each other such that the respective N-type semiconductor layers are electrically connected to each other and the respective P-type semiconductor layers are electrically connected to each other, a parallel circuit configured of the laminated and joined unit elements is formed, and thus generation of the electric charges can be further increased in accordance with the number of the joined unit elements.

A heat flow switching element according to a third invention is characterized in that, in the second invention, each of the unit elements includes, on the substrate, an N-side electrode connected to the N-type semiconductor layer and a P-side electrode connected to the P-type semiconductor layer, and the respective N-side electrodes of the plurality of unit elements are connected to each other via N-side through holes formed in the substrates and the respective P-side electrodes of the plurality of unit elements are connected to each other via P-side through holes formed in the substrates.

That is, in this heat flow switching element, since the respective N-side electrodes of the plurality of unit elements are connected to each other via the N-side through holes formed in the substrates and the respective P-side electrodes of the plurality of unit elements are connected to each other via the P-side through holes formed in the substrates, the laminated and joined unit elements can easily form the parallel circuit via the N-side through-holes and the P-side through-holes.

A heat flow switching element according to a fourth invention is characterized in that, in any one of the first to third inventions, high heat conduction portions formed of a material having higher thermal conductivity than the substrate are provided at both ends of the substrate.

That is, in this heat flow switching element, since the high thermal conduction portions formed of a material having higher thermal conductivity than the substrate are provided at both ends of the substrate, contact thermal resistance at both ends can be reduced, and thus heat flow between both ends can be promoted, thereby obtaining a high heat flow switching property in a direction from end to end.

A heat flow switching element according to a fifth invention is characterized in that, in any one of the first to fourth inventions, the insulator layer is formed of a dielectric.

That is, in this heat flow switching element, since the insulator layer is formed of a dielectric, electric charges are also generated on the dielectric insulator layer sides at the interfaces between the N-type semiconductor layer, the P-type semiconductor layer, and the insulator layer, a larger variation in thermal conductivity and higher thermal responsiveness can be obtained. In addition, since it is a mechanism that physically varies the thermal conductivity without using a chemical reaction mechanism, it is possible to immediately shift to a state in which thermal conduction has changed, therby obtaining good thermal responsiveness.

According to the present invention, the following effects can be obtained.

That is, according to the heat flow switching element of the present invention, since one semiconductor layer of the N-type semiconductor layer and the P-type semiconductor layer is formed on the substrate, the insulator layer is formed on the one semiconductor layer, and the other semiconductor layer of the N-type semiconductor layer and the P-type semiconductor layer is formed on the insulator layer, electric charges induced by an external voltage are generated both at and near an interface between the N-type semiconductor layer and the insulator layer and at and near an interface between the P-type semiconductor layer and the insulator layer. Accordingly, the generated charges increase, and a larger variation in thermal conductivity and high thermal responsiveness can be obtained. In particular, since each layer of the N-type semiconductor layer, the P-type semiconductor layer, and the insulator layer is formed on the substrate, flatness and mechanical strength of the entire element can be ensured

BRIEF DESCRIPTION OF THE DRAWINGS

FIG. 6 is a graph showing time dependency of a surface temperature ($\Delta T/\Delta T_{MAX}$) when measured by a pulsed light heating thermoreflectance method (FF method) in Reference Example 1 of the heat flow switching element according to the present invention.

FIG. 7 is a graph showing time dependence of a surface temperature ($\Delta T/\Delta T_{MAX}$) when measured by the pulsed light heating thermoreflectance method (FF method) in Example 1 of the heat flow switching element according to the present invention.

DETAILED DESCRIPTION OF THE INVENTION

Figure 1:
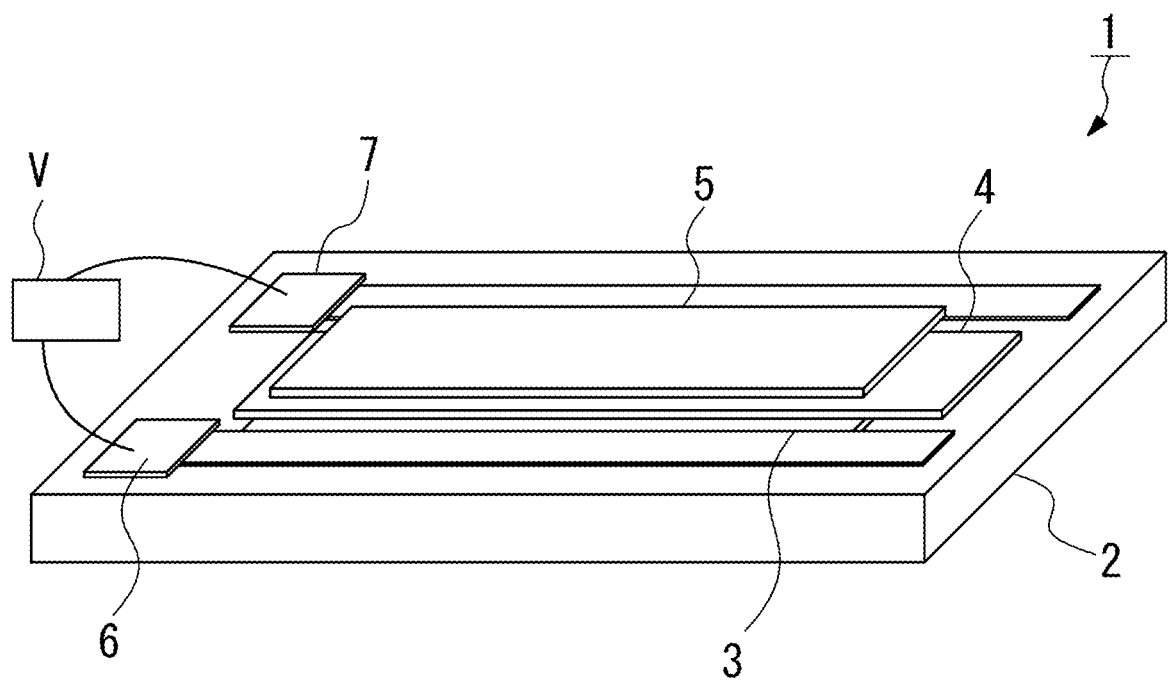
FIG. 1 is a perspective view showing a first embodiment of a heat flow switching element according to the present invention.

Hereinafter, a first embodiment of a heat flow switching element according to the present invention will be described with reference to FIGS. 1 to 3. Also, in the drawings used in the following description, scales are appropriately changed as necessary in order to make each part recognizable or easy to recognize.

Figure 2:
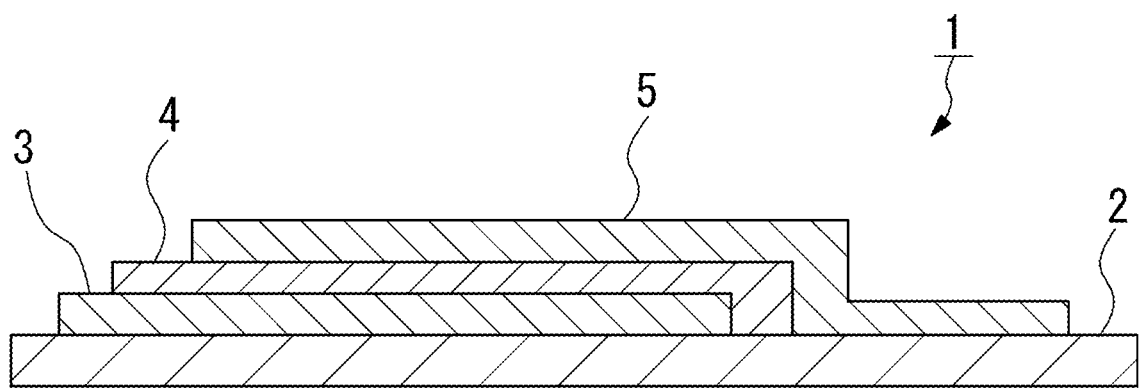
FIG. 2 is a cross-sectional view showing the heat flow switching element according to the first embodiment.
Figure 3:
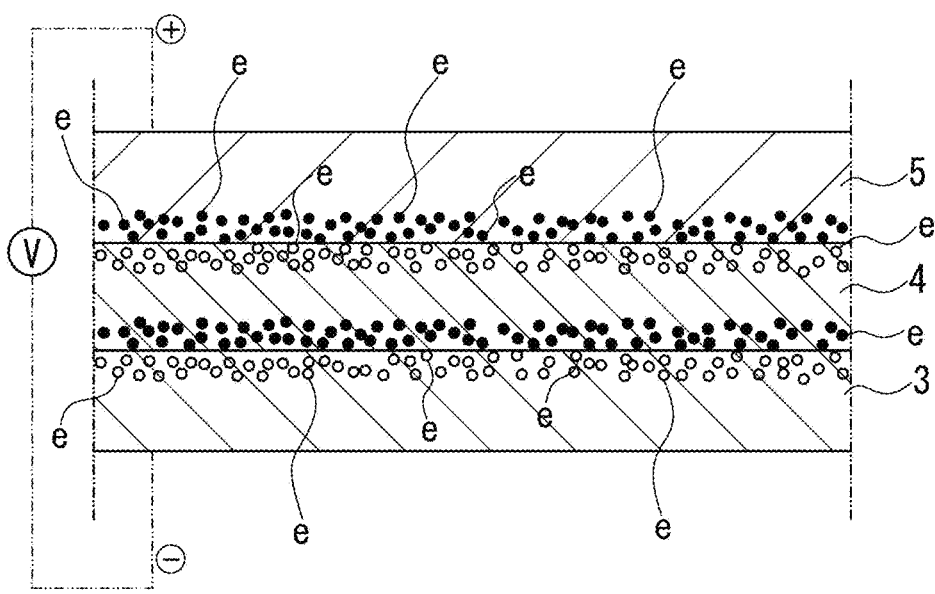
FIG. 3 is a conceptual diagram for explaining a principle of the heat flow switching element according to the first embodiment.

As shown in FIGS. 1 to 3, a heat flow switching element 1 according to the present embodiment includes a substrate 2 of which at least an upper surface is formed of an insulating material, an N-type semiconductor layer 3, a P-type semiconductor layer 5, and an insulator layer 4.

One semiconductor layer of the N-type semiconductor layer 3 and the P-type semiconductor layer 5 is formed on the substrate 2, the insulator layer 4 is formed on the one semiconductor layer, and the other semiconductor layer of the N-type semiconductor layer 3 and the P-type semiconductor layer 5 is formed on the insulator layer 4.

For example, in the present embodiment, the N-type semiconductor layer 3 is formed on the substrate 2, the insulator layer 4 is formed on the N-type semiconductor layer 3, and the P-type semiconductor layer 5 is formed on the insulator layer 4.

Various film forming methods such as a sputtering method, pulsed laser deposition method, chemical vapor deposition and a molecular beam epitaxy method (a MBE method) are adopted as a film forming method. Further, the N-type semiconductor layer 3, the insulator layer 4, and the P-type semiconductor layer 5 are formed by patterning on the substrate 2 using a metal mask, an etching process, or the like.

Further, the heat flow switching element 1 of the present embodiment includes, on the substrate 2, an N-side electrode 6 connected to the N-type semiconductor layer 3 and a P-side electrode 7 connected to the P-type semiconductor layer 5.

Also, when a voltage can be directly applied to the N-type semiconductor layer 3 and the P-type semiconductor layer 5, the N-side electrode 6 and the P-side electrode 7 are unnecessary. That is, the N-type semiconductor layer 3 and the P-type semiconductor layer 5 may be directly connected to each other using wire bonding or lead wires.

The insulator layer 4 is formed of a dielectric.

An external power supply V is connected to the N-side electrode 6 and the P-side electrode 7, and thus a voltage is applied thereto.

The N-type semiconductor layer 3 and the P-type semiconductor layer 5 are formed of thin films having thicknesses of less than 1 µm. In particular, since electric charges e (a positive electric charge and a negative electric charge) generated at the interfaces with the insulator layer 4 and in the vicinities thereof mainly accumulate in a thickness range of 5 to 10 nm, the N-type semiconductor layer 3 and the P-type semiconductor layer 5 are more preferably formed to thicknesses of 100 nm or less. Also, the N-type semiconductor layer 3 and the P-type semiconductor layer 5 preferably have thicknesses of 5 nm or more.

In FIG. 3, the type of the electric charges e generated at and in the vicinity of the interface between the N-type semiconductor layer 3 and the insulator layer 4 are negative electrons (negative electric charges) generated at the side of N-type semiconductor layer 3 and positive holes (positive electric charges) generated at the side of the insulator layer 4. Further, the type of the electric charges e generated at and in the vicinity of the interface between the P-type semiconductor layer 5 and the insulator layer 4 are positive holes generated at the side of P-type semiconductor layer 5 and negative electrons generated at the side of the insulator layer 4. Negative electrons are indicated by white circles. Positive holes are indicated by black circles. (The positive holes are holes formed by lack of electrons in a valence band of a semiconductor and appear to have relatively positive electric charges.)

Further, in order to ensure flatness and mechanical strength of the entire element, the substrate 2 preferably has a strength with which it can be handled as a single substrate, and specifically, a thickness thereof is preferably 0.1 mm or more, and more preferably 0.5 mm or more.

Also, the N-type semiconductor layer 3 and the P-type semiconductor layer 5 are formed of thin films having thicknesses of less than 1 µm. Even if the thickness is 1 µm or more, an effect of generating a charge does not change functionally. Accordingly, useless portions that do not contribute to switching heat flow are reduced, and thus reduction in manufacturing costs and reduction in thickness can be achieved.

Further, a thickness of the insulator layer 4 is preferably 40 nm or more and is set to a thickness at which insulation breakdown does not occur. In addition, if the insulator layer 4 is too thick, it is difficult to carry the electric charge e, and thus the thickness of the insulator layer 4 is preferably less than 1 µm. Therefore, the insulator layer 4 is preferably configured to be thinner than the substrate 2.

For the N-type semiconductor layer 3 and the P-type semiconductor layer 5, a degenerate semiconductor material having low lattice thermal conductivity is preferable, and, for example, a thermoelectric material such as Si—Ge system, a nitride semiconductor such as Cr—N system, and an oxide semiconductor such as $VO_2$ can be used. Also, the N-type and P-type are set by adding N-type and P-type dopants to the semiconductor material.

The insulator layer 4 is preferably made of an insulating material having low thermal conductivity, and an insulator such as $SiO_2$, a dielectric such as $HfO_2$ or $BiFeO_3$, and an organic material such as polyimide (PI) can be employed therefor. In particular, a dielectric material having a high dielectric constant is preferable.

Also, for example, an insulating glass substrate may be employed for the substrate 2. In addition, for the substrate 2, a substrate in which an insulating oxide film $SiO_2$ is formed on a Si substrate may be used.

The N-side electrode 6 and the P-side electrode 7 are formed of, for example, a metal such as Mo or Al.

The N-type semiconductor layer 3 and the P-type semiconductor layer 5 are formed by patterning to extend to one end of the rectangular plate-shaped substrate 2. In addition, the N-side electrode 6 is connected to an end of the N-type semiconductor layer 3, and the P-side electrode 7 is connected to an end of the P-type semiconductor layer 5.

As shown in FIG. 3, since the heat flow switching element 1 of the present embodiment generates a heat conductible charge e at and near the interface between the N-type semiconductor layer 3 and the insulator layer 4 by applying an electric field (a voltage), the generated electric charge e carries heat, and thus thermal conductivity changes.

Also, the thermal conductivity is obtained by the following equation.

Thermal conductivity=lattice thermal conductivity+ electron thermal conductivity Between the two types of thermal conductivity, the thermal conductivity that varies in accordance with an amount of charge generated by applying an electric field (a voltage) is the electron thermal conductivity. Therefore, in the present embodiment, a material having small lattice thermal conductivity is suitable for obtaining alarger variation in thermal conductivity. Therefore, a material having low lattice thermal conductivity, that is, low thermal conductivity, is selected for any of the N-type semiconductor layer 3, the insulator layer 4, and the P-type semiconductor layer 5.

The thermal conductivity of a material constituting each layer of the present embodiment is preferably 5 W/mK or less, more preferably 1 W/mK or less, and the materials mentioned above can be employed therefor.

Further, the electron thermal conductivity increases in accordance with an amount of charge e generated according to the applied external electric field (voltage).

In addition, since electric charges e are generated at the interfaces between the N-type semiconductor layer 3, the P-type semiconductor layer 5 and the insulator layer 4, an amount of the generated charges e can be increased by increasing a total area of the interfaces.

The thermal conductivity is measured by, for example, a pulsed light heating thermoreflectance method that is a method for determining thermal diffusivity or thermal effusivity of a thin film in a film thickness direction by instantaneously heating a thin film sample formed on a substrate with a pulsed laser and measuring a rate of decrease or increase in surface temperature due to thermal diffusion into the thin film. In addition, in the pulsed light heating thermoreflectance method, a method for directly measuring thermal diffusion (a rear surface heating/front surface temperature detection (RF) method) requires using a transparent substrate through which a pulsed laser can pass. For this reason, when the substrate is not transparent, the thermal conductivity is measured by a front surface heating/front surface temperature detection (FF) method, which is a method of measuring thermal effusivity and converting it into thermal conductivity. Also, this measurement requires a metal film, and Mo, Al, or the like is adopted therefor.

As described above, in the heat flow switching element 1 according to the present embodiment, since one semiconductor layer of the N-type semiconductor layer 3 and the P-type semiconductor layer 5 is formed on the substrate 2, the insulator layer 4 is formed on the one semiconductor layer, and the other semiconductor layer of the N-type semiconductor layer 3 and the P-type semiconductor layer 5 is formed on the insulator layer 4, charges e are generated both at and near the interface between the N-type semiconductor layer 3 and the insulator layer 4 and at and near the interface between the P-type semiconductor layer 5 and the insulator layer 4. Accordingly, the electric charges generated by an external voltage increase, and a larger variation in thermal conductivity and high thermal responsiveness can be obtained. In addition, since it is a mechanism that physically varies the thermal conductivity without using a chemical reaction mechanism, it is possible to immediately shift to a state in which heat conduction has changed, thereby obtaining good thermal responsiveness.

Also, since an amount of charges induced at the interfaces varies depending on a value multiplied by a magnitude of the external voltage, the thermal conductivity can be adjusted by adjusting the external voltage, and thus heat flow can be actively controlled via this element. In addition, since the insulator layer 4 is an insulator, no electric current is generated as the voltage is applied thereto, and thus Joule heat does not occur as the voltage is applied. For that reason, heat flow can be actively controlled without self-heating.

In particular, since each layer of the N-type semiconductor layer 3, the P-type semiconductor layer 5, and the insulator layer 4 is formed on the substrate 2, the entire element can ensure flatness and mechanical strength.

Further, since the insulator layer 4 is formed of a dielectric, charges are also generated on the dielectric insulator layer 4 sides at the interfaces between the N-type semiconductor layer 3, the P-type semiconductor layer 5 and the insulator layer 4, a larger variation in thermal conductivity and higher thermal responsiveness can be obtained.

Next, second and third embodiments of the heat flow switching element according to the present invention will be described below with reference to FIGS. 4 and 5. Also, in the following description of each embodiment, the same components as those described in the above embodiment are denoted by the same reference numerals, and descriptions thereof will be omitted.

Figure 4:
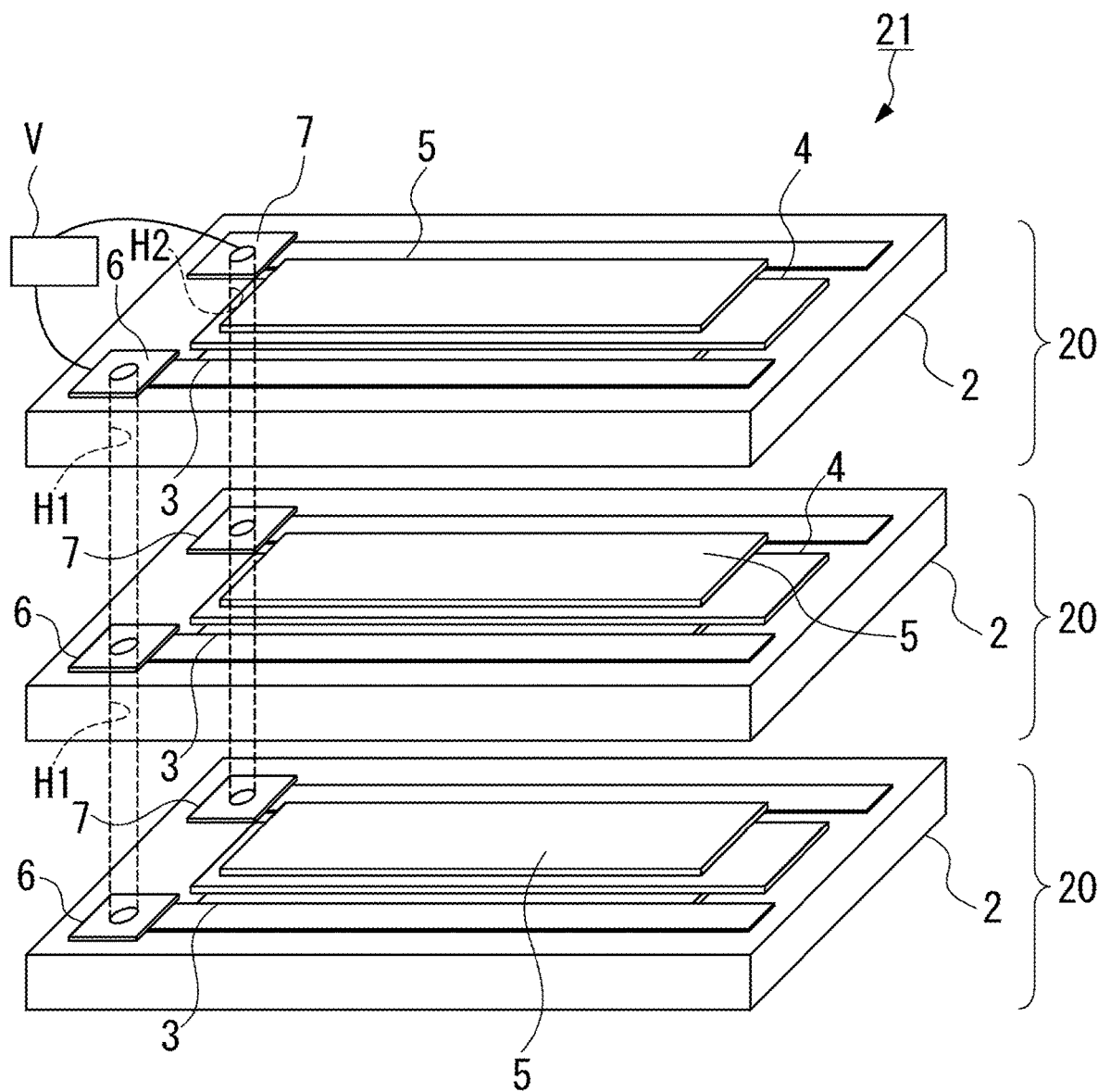
FIG. 4 is an exploded perspective view showing a second embodiment of the heat flow switching element according to the present invention.
Figure 5:
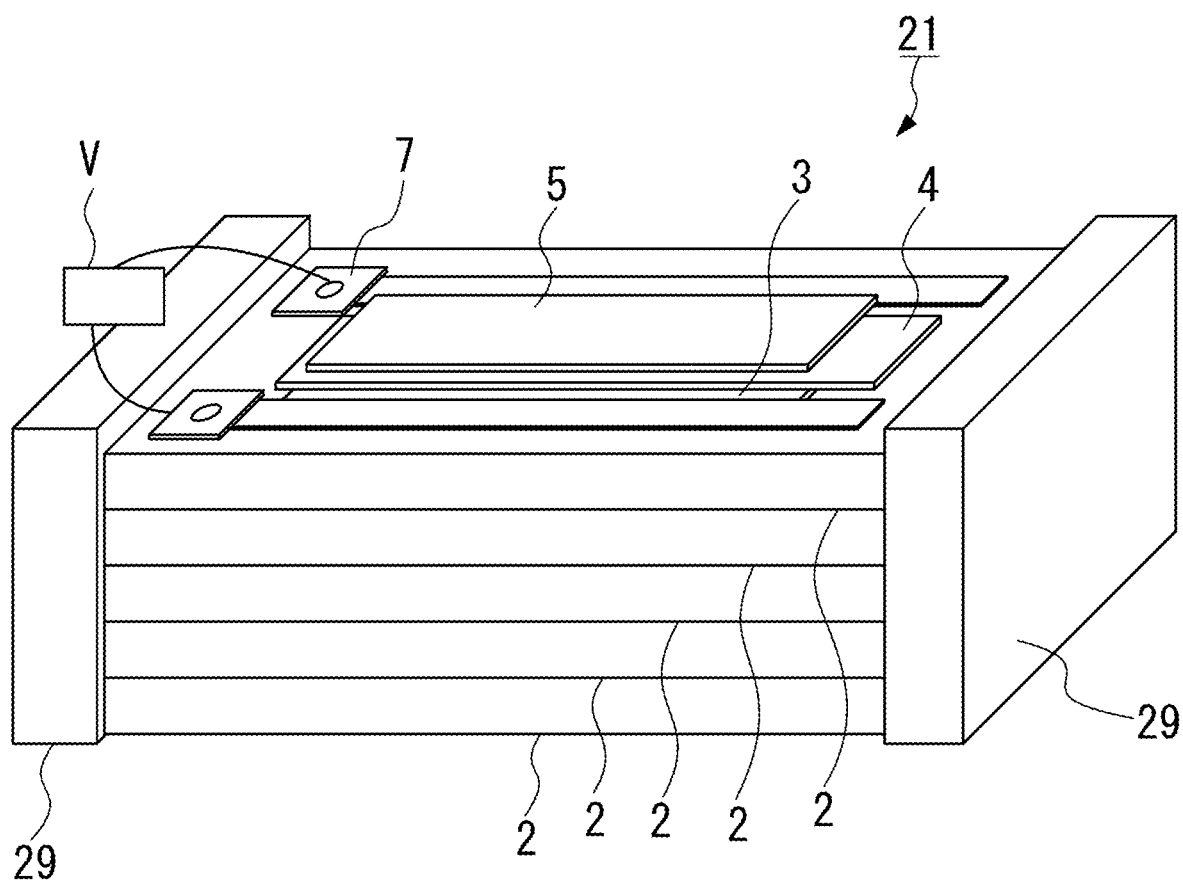
FIG. 5 is a perspective view showing the heat flow switching element according to the second embodiment.

A difference between the second embodiment and the first embodiment is the point that, in the first embodiment, the substrate 2, the N-type semiconductor layer 3, and the P-type semiconductor layer 5 are formed one by one, whereas, in the heat flow switching element 21 of the second embodiment, as shown in FIGS. 4 and 5, a plurality of unit elements 20 each including the substrate 2, the N-type semiconductor layer 3, the P-type semiconductor layer 5, the N-side electrode 6, and the P-side electrode 7, are provided and the plurality of unit elements 20 are vertically laminated and joined to each other.

Further, in the second embodiment, the respective N-side electrodes 6 of the plurality of unit elements 20 are connected to each other via the N-side through holes H1 formed in the substrates 2, and the respective P-side electrodes 7 of the plurality of unit elements 20 are connected to each other via the P-side through holes H2 formed in the substrates.

The unit elements 20 are laminated and joined to each other with an adhesive or the like.

The N-side through holes H1 and the P-side through holes H2 penetrate the substrates 2, and metal conductors and the like are formed on inner surfaces thereof to electrically connect the vertically laminated unit elements 20 to each other.

The substrate 2 is made of a material having an insulating property and is a glass substrate having a rectangular shape, a resin substrate made of polyimide and the like, an Si substrate with a thermal oxide film, or the like, and high thermal conductive portions 29 formed of a material having higher thermal conductivity than the substrate 2 are provided at both ends of the substrate 2. That is, the high thermal conductive portions 29 are provided on both end surfaces of the heat flow switching element 21 when the unit elements 20 are laminated and joined together. The high thermal conductive portions 29 are formed of a material such as a silicone resin.

As described above, in the heat flow switching element 21 of the second embodiment, since the plurality of unit elements 20 are vertically laminated and joined to each other such that the respective N-type semiconductor layers 3 are electrically connected to each other and the respective P-type semiconductor layers 5 are electrically connected to each other, a parallel circuit of the laminated and joined unit elements 20 is formed, and thus generation of the charges e can be further increased in accordance with the number of the joined unit elements 20.

In particular, since the N-side electrodes 6 of the plurality of unit elements 20 are connected to each other via the N-side through holes H1 formed in the substrates 2 and the P-side electrodes 7 of the plurality of unit elements 20 are connected to each other via the P-side through holes H2 formed in the substrates 2, the laminated and joined unit elements 20 can easily form the parallel circuit via the N-side through holes H1 and the P-side through holes H2.

Also, since the high thermal conductive portions 29 formed of a material having higher thermal conductivity than the substrate 2 are provided at both ends of the substrate 2, contact thermal resistance at both ends can be reduced, and thus heat flow between both ends can be promoted and a heat switching property can be obtained in the direction from end to end.

In addition, a laminated structure of the P-type semiconductor layer 5/the substrate 2 (insulator)/the N-type semiconductor layer 3 can be obtained in the laminating direction through the insulating substrate 2 by making the substrate 2 thinner, electric charges e are also generated at the interfaces with the substrate 2, and thus the charges e can be further increased.

Further, heat conduction can also vary in the laminating direction. Accordingly, by providing outer peripheral thermal insulating portions which cover outer edges of the N-type semiconductor layers 3, the insulator layers 4, and the P-type semiconductor layers 5 and providing high thermal conductive portions on an uppermost surface and a lowermost surface with a material having higher thermal conductivity than the outer peripheral thermal insulating portions, heat flow in an in-plane direction can be inhibited and a heat flow switching property in the laminating direction can be obtained.

Also, as the substrate 2 is set to be thinner, a charge generation effect in the laminating and joining direction can be more easily obtained.

EXAMPLE

Reference Example 1

Using the following materials, an insulator layer, a P-type semiconductor layer, and a P-side electrode were laminated on an N-type semiconductor layer to obtain Reference Example 1 of the present invention, and a change in thermal conductivity thereof was measured.

N-type semiconductor layer: Si substrate of N-type semiconductor (0.5 mm thick)
Insulator layer: $SiO_2$ (100 nm thick)
P-type semiconductor layer: $Si_{0.375}Ge_{0.575}Au_{0.05}$ (40 nm thick)
P-side electrode: Mo (100 nm thick)

Also, it was confirmed that each of $SiO_2$ (100 nm thick) and $Si_{0.375}Ge_{0.575}Au_{0.05}$ (40 nm thick) has thermal conductivity of less than 2 W/mK in a single film.

Further, $SiO_2$ (100 nm thick) was formed by a RF sputtering method, and $Si_{0.375}Ge_{0.575}Au_{0.05}$ (40 nm thick) was formed by an MBE method.

An Au wire was connected to the N-type semiconductor Si substrate and the P-side electrode Mo, and a voltage was applied thereto. The measurement was performed at room temperature.

Table 1 below and FIG. 6 show thermal effusivity with respect to a voltage and a rate of increase in thermal conductivity after voltage application in the measurement.

TABLE 1

| Voltage (V) | Thermal effusivity (W/s$^{0.5}$m$^2$K) | Rate of increase in thermal conductivity after voltage application (%) |
|---|---|---|
| 0 | 899.9 | 0.0% |
| 1 | 901.6 | 0.4% |
| 5 | 990.5 | 21.2% |
| 10 | 965.2 | 15.1% |
| 25 | 982.7 | 19.3% |
| 50 | 1027.0 | 30.3% |

Example 1

Using the following materials, an N-type semiconductor layer, an insulator layer, a P-type semiconductor layer, and a P-side electrode were laminated on a substrate to obtain Example 1 of the present invention, and a change in thermal conductivity thereof was measured.

Substrate: glass substrate (0.5 mm thick)
N-type semiconductor layer: $Si_{0.36}Ge_{0.56}P_{0.08}$ (40 nm thick)
Insulator layer: $SiO_2$ (30 nm thick)
P-type semiconductor layer: $Si_{0.375}Ge_{0.575}Au_{0.05}$ (20 nm thick)
P-side electrode: Mo (100 nm thick)

Also, it was confirmed that each of $Si_{0.36}Ge_{0.56}P_{0.08}$ (40 nm thick), $SiO_2$ (30 nm thick), and $Si_{0.375}Ge_{0.575}Au_{0.05}$ (20 nm thick) has thermal conductivity of less than 2 W/mK as a single film.

Further, $SiO_2$ (30 nm thick) is formed by a RF sputtering method, and $Si_{0.36}Ge_{0.56}P_{0.08}$ (40 nm thick) and $Si_{0.375}Ge_{0.575}Au_{0.05}$ (20 nm thick) are formed by an MBE method.

An Au wire was connected to the N-type semiconductor $Si_{0.36}Ge_{0.56}P_{0.08}$ and the P-side electrode Mo, and a voltage was applied thereto. The measurement was performed at room temperature.

Table 2 below and FIG. 7 show thermal effusivity with respect to a voltage and a rate of increase in thermal conductivity after voltage application in the measurement.

TABLE 2

| Voltage (V) | Thermal effusivity (W/s$^{0.5}$m$^2$K) | Rate of increase in thermal conductivity after voltage application (%) |
|---|---|---|
| 0 | 744.8 | 0.0% |
| 1 | 862.9 | 34.2% |
| 3 | 912.8 | 50.2% |
| 5 | 907.8 | 48.6% |
| 8 | 932.3 | 56.7% |

In addition, the thermal effusivity was measured using the FF method (front surface heating/front surface temperature detection) of the pulsed light heating thermoreflectance method (measurement device: PicoTR of Pico Therm Corporation).

The thermal conductivity is calculated from the thermal effusivity using the following equation.

Thermal conductivity $k$=(thermal effusivity $b^2$/volume heat capacity=(thermal effusivity $b)^2$/(specific heat×density)

Therefore, the rate of increase Δk in thermal conductivity after voltage application is evaluated by the following equation.

$$\Delta k = k(V)/k(0) - 1$$

$$\Delta k = b(V)^2/b(0)^2 - 1$$

k(V): Thermal conductivity during voltage application (W/mK)
k(0): Thermal conductivity without voltage application (W/mK)
b(V): Thermal effusivity during voltage application (W/s$^{0.5}$m$^2$K)
b(0): Thermal effusivity without voltage application (W/s$^{0.5}$m$^2$K)

In the measurement using the pulsed light heating thermoreflectance method (FF method), the thermal effusivity of the thin film is measured by instantaneously heating the element with a pulsed laser from the P-side electrode Mo film side and measuring a rate of decrease in surface temperature due to thermal diffusion into the thin film.

when the thermal effusivity is large, that is, the thermal conductivity is large, heat transmission increases, and a temperature lowering time becomes faster.

Also, FIGS. 6 and 7 show time dependency of a surface temperature, in which the surface temperature on a vertical axis is standardized at the maximum temperature (Maximum 1) when heated by the pulsed laser.

As a result of these measurements, in both Reference Example 1 and Example 1, it was confirmed that as the applied voltage is increased, the thermal effusivity increases and the rate of increase in thermal conductivity after voltage application was increased That is, it can be understood from the results of FIGS. 6 and 7 that a speed of decrease in surface temperature is faster in the case of applying the voltage, and the thermal effusivity is higher, that is, the thermal conductivity is higher as compared to a case in which no voltage is applied.

It was confirmed that, since the element has the insulator layer, Joule heat is not generated as the voltage is applied, and thermal conductivity can be physically and actively controlled without self-heating.

Also, the technical scope of the present invention is not limited to the above embodiments, and various modifications can be made without departing from the spirit of the present invention.

EXPLANATION OF REFERENCES 1,21 Heat flow switching element
3 N-type semiconductor layer
4 Insulator layer
5 P-type semiconductor layer
6 N-side electrode
7 P-side electrode
29 High thermal conductive portion
H1 N-side through hole
H2 P-side through hole
V External power supply
2 Substrate
20 Plurality of unit elements
e Charges

What is claimed is:

1. A heat flow switching element comprising:
a substrate of which at least an upper surface is formed of an insulating material;
an N-type semiconductor layer;
a P-type semiconductor layer;
an insulator layer;
an N-side electrode electrically connected to the N-type semiconductor layer; and
a P-side electrode electrically connected to the P-type semiconductor layer,
wherein one semiconductor layer of the N-type semiconductor layer and the P-type semiconductor layer is formed on the substrate, the insulator layer is formed on the one semiconductor layer of the N-type semiconductor layer and the P-type semiconductor layer, and the other semiconductor layer of the N-type semiconductor layer and the P-type semiconductor layer is formed on the insulator layer, and
the N-type semiconductor layer and the P-type semiconductor layer are not electrically connected to each other within the heat flow switching element, and
thermal conductivity of the heat flow switching element changes by applying an external voltage to the N-side electrode and the P-side electrode.

2. The heat flow switching element according to claim 1, wherein a plurality of unit elements each including the substrate, the N-type semiconductor layer, and the P-type semiconductor layer are provided, and
the plurality of unit elements are vertically laminated and joined to each other such that the respective N-type semiconductor layers are electrically connected to each other and the respective P-type semiconductor layers are electrically connected to each other.

3. The heat flow switching element according to claim 2, wherein each of the unit elements includes, on the substrate, the N-side electrode connected to the N-type semiconductor layer and the P-side electrode connected to the P-type semiconductor layer, the respective N-side electrodes of the plurality of unit elements are connected to each other via N-side through holes formed in the substrates, and
the respective P-side electrodes of the plurality of unit elements are connected to each other via P-side through holes formed in the substrates.

4. The heat flow switching element according to claim 1, wherein high heat conduction portions formed of a material having higher thermal conductivity than the substrate are provided at both ends of the substrate.

5. The heat flow switching element according to claim 1, wherein the insulator layer is formed of a dielectric.

* * * * *